(12) United States Patent
Li

(10) Patent No.: US 11,894,422 B2
(45) Date of Patent: Feb. 6, 2024

(54) GATE-CONTROLLED DIODE AND CHIP

(71) Applicant: HUAWEI TECHNOLOGIES CO., LTD., Shenzhen (CN)

(72) Inventor: Wei Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 295 days.

(21) Appl. No.: 17/208,492

(22) Filed: Mar. 22, 2021

(65) Prior Publication Data

US 2021/0226046 A1 Jul. 22, 2021

Related U.S. Application Data

(63) Continuation of application No. PCT/CN2018/109179, filed on Sep. 30, 2018.

(51) Int. Cl.
*H01L 29/739* (2006.01)
*H01L 29/24* (2006.01)
(Continued)

(52) U.S. Cl.
CPC .......... *H01L 29/0665* (2013.01); *H01L 29/24* (2013.01); *H01L 29/4236* (2013.01);
(Continued)

(58) Field of Classification Search
CPC .......... H01L 29/66356; H01L 29/7391; H01L 29/42356; H01L 29/4236; H01L 29/66969;
(Continued)

(56) References Cited

U.S. PATENT DOCUMENTS

2009/0085163 A1    4/2009   Russ et al.
2015/0171202 A1    6/2015   Takahashi
(Continued)

FOREIGN PATENT DOCUMENTS

CN     101005099 A    7/2007
CN     101405868 A    4/2009
(Continued)

OTHER PUBLICATIONS

Xiaochi Liu et al., "Modulation of Quantum Tunneling via a Vertical Two-Dimensional Black Phosphorus and Molybdenum Disulfide p-n Junction",2017 American Chemical Society,total 8 pages.
(Continued)

*Primary Examiner* — Yu Chen
(74) *Attorney, Agent, or Firm* — HAUPTMAN HAM, LLP

(57) ABSTRACT

A gate-controlled diode includes a substrate, a gate stacked on the substrate, a gate insulation layer, a first two-dimensional semiconductor layer, a second two-dimensional semiconductor layer, a source, and a drain disposed separately from the source. The gate is embedded in a surface of the substrate, and the gate insulation layer covers the surface of the substrate in which the gate is disposed. The first two-dimensional semiconductor layer is stacked on the gate insulation layer, a portion of the second two-dimensional semiconductor layer is stacked on the gate insulation layer, another portion is stacked on the first two-dimensional semiconductor layer. The another portion of the second two-dimensional semiconductor layer stacked on the first two-dimensional semiconductor layer forms a heterojunction. An orthographic projection of the heterojunction onto the substrate is in an orthographic projection of the gate onto the substrate.

20 Claims, 12 Drawing Sheets

(51) Int. Cl.
*H01L 29/06* (2006.01)
*H01L 29/66* (2006.01)
*H01L 29/423* (2006.01)
*H01L 29/417* (2006.01)

(52) U.S. Cl.
CPC .... *H01L 29/66969* (2013.01); *H01L 29/7391* (2013.01); *H01L 29/0653* (2013.01); *H01L 29/41775* (2013.01)

(58) Field of Classification Search
CPC . H01L 29/41775; H01L 29/24; H01L 29/267; H01L 29/1054; H01L 29/0665; H01L 29/42312; H01L 29/42316; H01L 29/1606; H01L 29/78681; H01L 29/78684; H01L 29/48696; H01L 29/165; H01L 29/78669; H01L 29/78678; H01L 29/78696
See application file for complete search history.

(56) References Cited

U.S. PATENT DOCUMENTS

| | | | |
|---|---|---|---|
| 2015/0221499 A1* | 8/2015 | Park | H01L 21/02118 257/29 |
| 2016/0322460 A1* | 11/2016 | Chung | H01L 29/7391 |
| 2017/0098716 A1* | 4/2017 | Li | H01L 29/18 |
| 2018/0182898 A1* | 6/2018 | Moroz | H01L 29/0665 |
| 2018/0204953 A1* | 7/2018 | Zhu | H01L 29/24 |
| 2020/0395473 A1* | 12/2020 | Hersam | H01L 21/02631 |

FOREIGN PATENT DOCUMENTS

| | | |
|---|---|---|
| CN | 102592997 A | 7/2012 |
| CN | 106685247 A | 5/2017 |
| CN | 107104140 A | 8/2017 |
| CN | 107248530 A | 10/2017 |

OTHER PUBLICATIONS

Xiao Yan et al.,"Tunable SnSe2/WSe2 Heterostructure Tunneling Field Effect Transistor",2017 Wiley-VCH Verlag GmbH & Co. KGaA, Weinheim,total 8 pages.

* cited by examiner

GATE-CONTROLLED DIODE AND CHIP

CROSS-REFERENCE TO RELATED APPLICATIONS

This application is a continuation of International Application No. PCT/CN2018/109179, filed on Sep. 30, 2018, the disclosure of which is hereby incorporated by reference in its entirety.

TECHNICAL FIELD

The present disclosure relates to the field of electronic communications technologies, and in particular, to a semiconductor device, and further to a gate-controlled diode and a chip having the gate-controlled diode.

BACKGROUND

Common semiconductor devices such as diodes are widely used in circuits such as rectifier, detection, amplitude limiting, and voltage regulator circuits, and belong to a type of device having two electrodes. A conventional crystal diode is a p-n junction including a p-type semiconductor and an n-type semiconductor. A space charge layer is formed on two sides of an interface of the p-n junction, and there is a self-built electric field. When there is no voltage applied, a diffusion current caused by a difference between carrier concentration on two sides of the p-n junction and a drift current caused by the self-built electric field are equal and are in an electrical equilibrium state. When a forward voltage bias is generated, a mutual suppression effect of an external electric field and the self-built electric field of the diode increases a diffusion current of carriers. This causes a forward current. When a reverse voltage bias is generated, the external electric field and the self-built electric field are further strengthened to form a reverse saturation current (disconnected) that is independent of a reverse bias voltage in a particular reverse voltage range. In this case, an independent diode allows a current to flow through the diode only in a single direction (forward direction or reverse direction); consequently, flexibility of the diode in circuits is comparatively low.

SUMMARY

Embodiments of this application provide a semiconductor device that can control a conduction direction, to improve application flexibility of the semiconductor device.

According to a first aspect, this application provides a gate-controlled diode, including a substrate, a gate stacked on the substrate, a gate insulation layer, a first two-dimensional semiconductor layer, a second two-dimensional semiconductor layer, a source, and a drain disposed separately from the source.

The gate is embedded in a surface of the substrate, and the gate insulation layer covers a surface, in which the gate is disposed, of the substrate.

The first two-dimensional semiconductor layer is formed of a bipolar conductive material, the first two-dimensional semiconductor layer is stacked on the gate insulation layer, a portion of the second two-dimensional semiconductor layer is stacked on the gate insulation layer, another portion is stacked on the first two-dimensional semiconductor layer, the another portion of the second two-dimensional semiconductor layer stacked on the first two-dimensional semiconductor layer forms a heterojunction, and an orthographic projection of the heterojunction onto the substrate is located in an orthographic projection of the gate onto the substrate.

The source is electrically connected to the second two-dimensional semiconductor layer and is insulated from the first two-dimensional semiconductor layer, the drain is electrically connected to the first two-dimensional semiconductor layer and is insulated from the second two-dimensional semiconductor layer, and a conducting path of the gate-controlled diode is from the source to the drain through the heterojunction, or from the drain to the source through the heterojunction.

In the gate-controlled diode in this application, a two-dimensional semiconductor is used to form the heterojunction, the source and the drain are located on two sides of the heterojunction, the gate is disposed to be in a recess of the substrate, and parasitic capacitance between the gate and the source and drain is reduced. In addition, the first two-dimensional semiconductor layer connected to the drain has bipolar conductivity, one of $HfO_2$, $Al_2O_3$, $ZrO_2$, $Hf_xZr_{1-x}O_2$, HfLaO, or $Y_2O_3$ is used for the gate insulation layer, and the gate insulation layer is comparatively thin. In some embodiments, the thickness is only 10 nm, such that the gate has plenty of gate capacitance. Bi-directionality of the conducting path of the gate-controlled diode can be controlled using a gate voltage, such that the diode is adjustable to forward conduction or reverse conduction, and has comparatively high application flexibility when compared with a single-direction diode in the conventional technology.

In an implementation, a side that is of the gate and that is away from a oxide protective layer protrudes from a surface of the oxide protective layer or is flush with a surface of the oxide protective layer. In some embodiments, a surface of the side that is of the gate and that is away from the oxide protective layer is flush with the surface of the oxide protective layer, to ensure that the gate insulation layer has comparatively good flatness, and cracks and wrinkles, which accordingly affect device performance, are not easy to occur in a process of preparing the first two-dimensional semiconductor layer and the second two-dimensional semiconductor layer.

A material of the first two-dimensional semiconductor layer is tungsten diselenide, and a material of the second two-dimensional semiconductor layer is tin diselenide, but the materials are not limited to the two listed two-dimensional semiconductor materials.

The first two-dimensional semiconductor layer includes a first portion and a second portion connected to the first portion, the second two-dimensional semiconductor layer includes a third portion and a fourth portion connected to the third portion, the third portion is stacked on the first portion to form the heterojunction, the source is located on a surface of the fourth portion, and the drain is located on a surface of the second portion.

In an implementation, the gate-controlled diode further includes an isolation layer, and the isolation layer is located between the drain and an end of the second two-dimensional semiconductor layer that forms the heterojunction. A material of the isolation layer is insulating oxide, and the isolation layer implements isolation between the drain and the second two-dimensional semiconductor layer.

In an implementation, in a vertical direction, the source is located above the heterojunction. In this case, intervention resistance is comparatively small, and a larger current is obtained.

In an implementation, the gate includes a bottom surface connected to the oxide protective layer, a first end surface close to the drain, and a second end surface close to the source, and the first end surface and the second end surface are connected to two opposite ends of the bottom surface.

The drain includes a first side surface, the source includes a second side surface spaced from and opposite to the first side surface, the first side surface is coplanar with the first end surface, and the second side surface and the second end surface are coplanar or have an effective distance. For example, the drain and the source are located on two opposite sides of the heterojunction, such that an overlapping part between the drain and source and the gate can be avoided, and parasitic capacitance between the drain and the gate can be reduced, thereby ensuring conductivity.

According to a second aspect, this application provides a chip, including a circuit and the gate-controlled diode applied to the circuit. The chip is an RF energy collection chip.

According to a third aspect, this application provides a method for preparing a gate-controlled diode, and the method includes the following steps.

Step 1: Form a recessed portion on a surface of an oxide protective layer of a substrate, and form a gate in the recessed portion. This step includes: using a photoresist to define a gate region on the oxide protective layer using a photolithography process, and using the photoresist as a mask to cover a part, other than the gate region, of the surface of the oxide protective layer;

etching the oxide protective layer located in the gate region in a reactive-ion etching manner, to form the recessed portion on the substrate;

forming the gate in the recessed portion in an evaporation manner, where the gate fills the recessed portion; and removing the photoresist, such that the gate is embedded in the oxide protective layer, and parasitic capacitance between the gate and a source and drain is reduced.

Step 2: Form a gate insulation layer on the surface of the oxide protective layer, such that the gate insulation layer covers the gate, to protect the gate and isolate a heterojunction from the oxide protective layer. A material of the gate insulation layer is one of $HfO_2$, $Al_2O_3$, $ZrO_2$, $HfxZr1-xO_2$, HfLaO, or $Y_2O_3$.

Step 3: Form a channel layer and the drain on the gate insulation layer, where the channel layer includes a first two-dimensional semiconductor layer, a second two-dimensional semiconductor layer, and the heterojunction formed by the first two-dimensional semiconductor layer and the second two-dimensional semiconductor layer, the drain is located on the first two-dimensional semiconductor layer and is insulated from the second two-dimensional semiconductor layer, a material of the first two-dimensional semiconductor layer is tungsten diselenide, and a material of the second two-dimensional semiconductor layer is tin diselenide.

In some embodiments, the step of forming a channel layer on the gate insulation layer includes:

forming, on a surface of the gate insulation layer, the first two-dimensional semiconductor layer and the drain that is located on a side of a surface of the first two-dimensional semiconductor layer;

using a photoresist to define, using a photolithography process, an isolation layer region on a layer structure including the first two-dimensional semiconductor layer and the drain, and using a photoresist as a mask to cover a part, other than the isolation layer region, of the first two-dimensional semiconductor layer and a portion of the drain;

forming an insulating oxide layer on the photoresist and the isolation layer region in a deposition manner;

removing the photoresist covered with the insulating oxide layer to form an isolation layer in the isolation layer region, where the isolation layer covers a portion of the drain and a connection position between the drain and the first two-dimensional semiconductor layer, and a material of the isolation layer is $SiO_2$ or $Al_2O_3$; and forming the second two-dimensional semiconductor layer on the surface of the gate insulation layer and the first two-dimensional semiconductor layer, where an overlapping part between the first two-dimensional semiconductor layer and the second two-dimensional semiconductor layer is the heterojunction, and the second two-dimensional semiconductor layer is connected to a side that is of the isolation layer and that is away from the drain.

In the method for preparing a gate-controlled diode in this application, the isolation layer is first formed before the second two-dimensional semiconductor layer is prepared. Existence of the isolation layer prevents unintended damage to a part that is of the first two-dimensional semiconductor layer and that is connected to the drain and consequent damage to performance of the gate-controlled diode caused in a process of preparing a pattern in the second two-dimensional semiconductor material layer in an etching manner. In addition, the isolation layer may isolate the drain from the second two-dimensional semiconductor layer, to prevent conduction between the drain and the second two-dimensional semiconductor layer.

Step 4: Form, on the channel layer, a source spaced from and opposite to the drain, where a first conduction direction is implemented from the source to the drain through the heterojunction, and a second conduction direction is implemented from the drain to the source through the heterojunction. The source is formed of a metal material using a patterning process.

In an implementation, the step of forming a recessed portion on a surface of an oxide protective layer of a substrate, and forming a gate in the recessed portion further includes: flattening the gate, such that a surface that exposes the recessed portion and that is of the gate is flush with the surface of the oxide protective layer, to ensure quality for a subsequent process of preparing the channel layer.

In the gate-controlled diode in this application, the source and the drain are located on two sides of the heterojunction, the gate is disposed to be in a recess of the substrate, and parasitic capacitance between the gate and the source and drain is reduced. In addition, the gate insulation layer using a non-silicon-dioxide material and a two-dimensional oxide layer including bidirectional conductivity are used, and a gate voltage may be used to control conduction polarity of a first two-dimensional material and further control the bi-directionality of the conducting path of the gate-controlled diode, to implement control on a conductivity direction and a threshold voltage, thereby improving application flexibility of the diode, achieving small-signal rectification, and reducing complexity of a small-signal rectification circuit.

DESCRIPTION OF EMBODIMENTS

The following clearly describes technical solutions in implementations of the present disclosure with reference to the accompanying drawings in the implementations of the present disclosure.

Figure 1A:
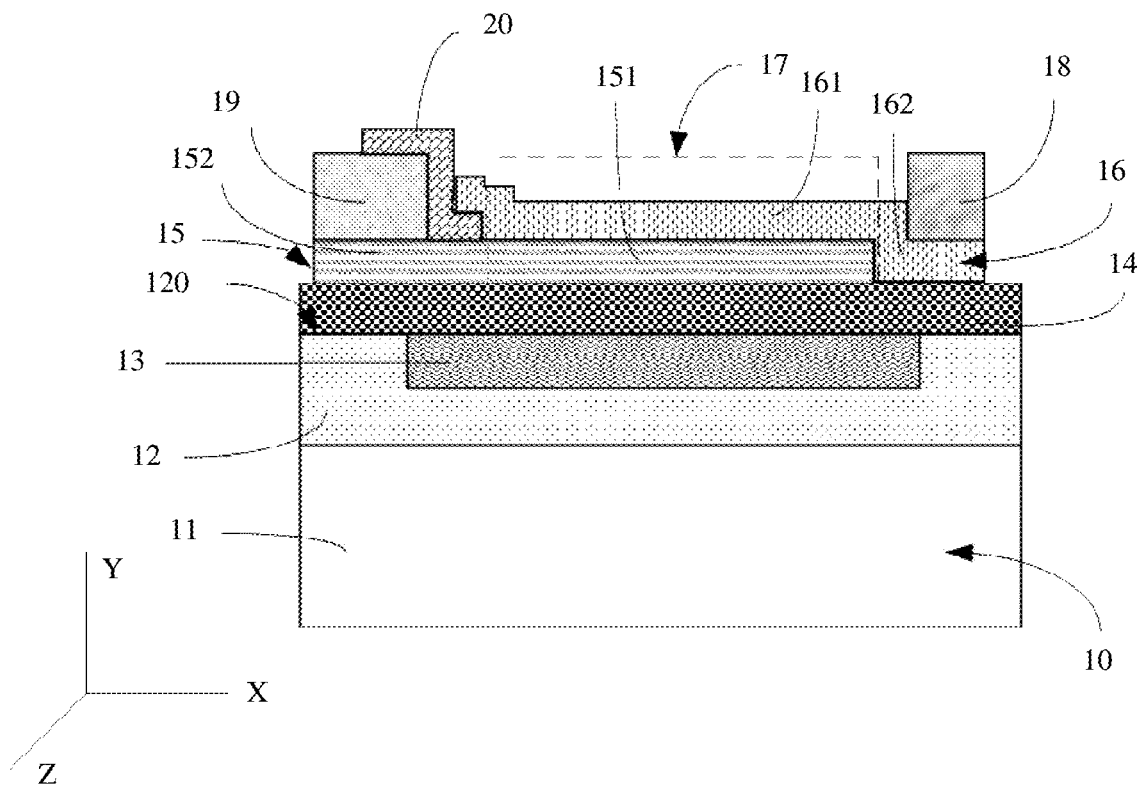
FIG. 1a is a cross-sectional schematic view of a gate-controlled diode, in accordance with one or more embodiments.
Figure 1B:
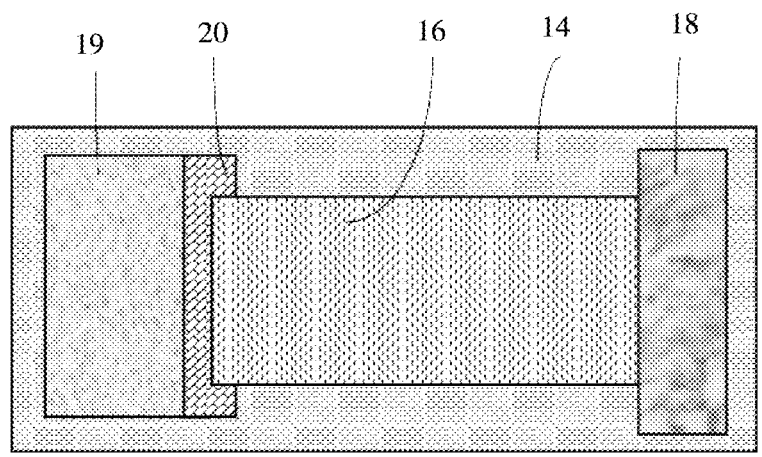
FIG. 1b is a top view of the gate-controlled diode shown in FIG. 1a, in accordance with one or more embodiments.

FIG. 1a and FIG. 1b are schematic views of a gate-controlled diode, in accordance with one or more embodiments. The gate-controlled diode is used in circuits such as a rectifier and a voltage regulator, and controls a threshold voltage using a gate voltage. A left-right direction is an X-axis direction, and a direction perpendicular to a thickness of the gate-controlled diode (perpendicular to a surface of a substrate) is a Y-axis direction. The X-axis direction is a length direction of a gate 13, a first two-dimensional semiconductor layer 15, and a second two-dimensional semiconductor layer 16. A width direction of the gate 13, the first two-dimensional semiconductor layer 15, and the second two-dimensional semiconductor layer 16 is a Z-axis direction.

The gate-controlled diode includes a substrate 10, an oxide protective layer 12 stacked on the substrate 10, the gate 13, a gate insulation layer 14, the first two-dimensional semiconductor layer 15, the second two-dimensional semiconductor layer 16, a source 18, and a drain 19. The source 18 and the drain 19 are disposed separately from each other. The gate 13 is embedded in the surface of the substrate 10, and the gate insulation layer 14 covers a surface, in which the gate 13 is disposed, of the substrate 10. In some embodiments, the gate insulation layer 14 is formed of a material having a high relative permittivity.

The first two-dimensional semiconductor layer 15 is formed of a material having bipolar conductivity, the first two-dimensional semiconductor layer 15 is stacked on the gate insulation layer 14, a portion of the second two-dimensional semiconductor layer 16 is stacked on the gate insulation layer 14, and another portion is stacked on the first two-dimensional semiconductor layer 15. The another portion of the second two-dimensional semiconductor layer 16 stacked on the first two-dimensional semiconductor layer 15 forms a heterojunction 17. An orthographic projection of the heterojunction 17 onto the base layer 11 is located in an orthographic projection of the gate 13 onto the base layer 11. The heterojunction is an interface area in which at least two different semiconductor materials are stacked in contact with each other.

The source 18 is electrically connected to the second two-dimensional semiconductor layer 16 and is insulated from the first two-dimensional semiconductor layer 15, and the drain 19 is electrically connected to the first two-dimensional semiconductor layer 15 and is insulated from the second two-dimensional semiconductor layer 16. A conducting path of the gate-controlled diode is from the source 18 to the drain 19 through the heterojunction 17, or from the drain 19 to the source 18 through the heterojunction 17.

In some embodiments, the function layers of the gate-controlled diode are of a regular structure, thicknesses of the function layers are evenly disposed, and a high operating efficiency can be ensured. Such design conforms to a development trend of miniaturization, lightness, and thinning of an existing chip, an electronic device, and the like. Because the source 18 and the drain 19 are disposed separately from each other and are not connected, a structure of the function layers, for implementing gate voltage control, of the gate-controlled diode can be truncated, provided that the heterojunction, the source, and the drain are truncated during cross section truncation. When these function layers are uneven, however, an electrical connection relationship of the function layers does not change, and a technical problem to be resolved in this application can be resolved and a technical effect of this application can be implemented, provided that a layer structure and a cooperation relationship of a cross section truncated are met. The function layers include the substrate, the gate, the gate insulation layer, the heterojunction, the source, the drain, and an isolation layer in a second embodiment of this application. For example, the source 18 and the drain 19 are cylindrical or of other irregular shapes, but their functions are cooperating with the heterojunction for an electron flow. The source 18 is electrically connected to the second two-dimensional semiconductor layer 16 and is insulated from the first two-dimensional semiconductor layer 15. The drain 19 is electrically connected to the first two-dimensional semiconductor layer 15 and is insulated from the second two-dimensional semiconductor layer 16. The first two-dimensional semiconductor layer 15 and the second two-dimensional semiconductor layer 16 are never in contact with the gate 13. A cross-sectional view and a top view are used as schematic reference diagrams for description of some embodiments.

In some embodiments, the gate-controlled diode uses a two-dimensional semiconductor to form the heterojunction, and a material of the first two-dimensional semiconductor layer 15 is tungsten diselenide. The tungsten diselenide is a material having bipolar conductivity. A material of the second two-dimensional semiconductor layer 16 is tin diselenide, and a material of the second two-dimensional semiconductor layer is a two-dimensional semiconductor material with heavy p-type or n-type ion doping, such as tin diselenide. The first two-dimensional semiconductor layer 15 connected to the drain 19 has bipolar conductivity, the heterojunction 17 is spaced from the gate 13 only by the gate insulation layer 14, and the gate insulation layer 14 is formed of a material having a high relative permittivity, such that the gate has plenty of gate capacitance to control conduction polarity of the first two-dimensional semiconductor layer 15, thereby implementing bi-directionality of the conducting path of the gate-controlled diode, namely, conduction from the source 18 to the drain 19 (reverse direction) through the heterojunction 17 or conduction from the drain 19 to the source 18 (forward direction) through the heterojunction 17. Therefore, the diode has characteristics of forward conduction and reverse conduction, and has comparatively high flexibility when compared with a single-direction diode in the conventional technology. In addition, the gate voltage can be controlled to control a threshold voltage of forward conduction or reverse conduction of the diode. When the threshold voltage is small, a loss of a signal voltage during rectification can be reduced, thereby reducing a loss of an operating voltage. When the gate 13 controls the first two-dimensional semiconductor layer 15 to change it to p-type doping, because the second two-dimensional semiconductor layer 16 is p-type or n-type heavy doping, the heterojunction of the first two-dimensional semiconductor layer 15 and the second two-dimensional semiconductor layer 16 is a pn+ type or an n+p type, cavity density is comparatively large to implement conduction, and the diode is a forward diode. When the gate controls the first two-dimensional semiconductor layer 15 to change it to n-type doping, electron density of the first two-dimensional semiconductor layer 15 is comparatively high to implement conduction, the heterojunction of the first two-dimensional semiconductor layer 15 and the second two-dimensional semiconductor layer 16 is an nn+ junction, and the diode is a reverse diode. Therefore, forward conduction or reverse conduction can be implemented, provided that a type of ion doping of the first two-dimensional semiconductor layer 15 is controlled.

The substrate 10 is formed of an insulating material such as quartz and sapphire, or the substrate 10 includes a base layer 11 and an oxide protective layer 12 stacked on a surface of the base layer 11. The base layer 11 is made of a silicon material, and the oxide protective layer 12 is made of a silicon dioxide material. In some embodiments, the substrate 10 includes the base layer 11 and the oxide protective layer 12. The oxide protective layer 12 covers the base layer 11 to form an entire surface of the gate-controlled diode, such that the oxide protective layer 12 and the base layer 11 form a substrate structure with oxide, to ensure carrier transmission. The gate insulation layer 14 uses one of $HfO_2$, $Al_2O_3$, $ZrO_2$, $Hf_xZr_{1-x}O_2$, HfLaO, or $Y_2O_3$ that has a high relative permittivity. The gate 13, the source 18, and the drain 19 are all made of conductive metal materials.

In some embodiments, the oxide protective layer 12 includes a first surface (not shown in the figures) connected to the base layer 11 and a second surface 120 disposed opposite to the first surface, and the first surface faces the base layer 11 and is connected to the base layer 11. The gate 13 is embedded in the second surface 120 of the oxide protective layer 12. A recessed portion is disposed on the second surface 120 of the oxide protective layer 12, and the gate 13 is formed in the recessed portion and fills the recessed portion. The oxide protective layer 12 is of a layer structure. In some embodiments, the recessed portion is a rectangular groove and is configured to accommodate the gate 13. Certainly, the recessed portion may alternatively be a groove in another shape.

In some embodiments, the gate 13 is a regular rectangular layer shape, and a surface of the gate 13 protrudes from the surface 120 of the oxide protective layer 12 or is flush with the surface 120 of the oxide protective layer 12. In some embodiments, the surface of the gate 13 is flush with the surface 120 of the oxide protective layer 12, such that flatness of the oxide semiconductor layer 11 and the gate 13 can be ensured, and comparatively high flatness of the gate insulation layer 14 can be ensured. In a process of preparing the first two-dimensional semiconductor layer 15 and the second two-dimensional semiconductor layer 16, cracks and wrinkles, which accordingly affect performance of the gate-controlled diode, are not easy to occur.

The gate insulation layer 14 covers the surface, in which the gate 13 is disposed, of the substrate 10. The gate insulation layer 14 covers the second surface 120 of the oxide protective layer 12, and is configured to insulate the gate 13 from another layer structure stacked on the gate 13. In some embodiments, the gate insulation layer 14 covers the entire second surface 120 of the oxide protective layer 12, which can be directly formed by placing the base layer 11 into an ALD chamber and growing using an atomic layer deposition technology (refer to FIG. 2b), such that a photolithography process is not required, thereby simplifying a processing step. The gate insulation layer 14 is made of a material having a high relative permittivity instead of silicon dioxide, and a thickness may be made comparatively thin using an atomic layer deposition technology, such that gate capacitance is increased, and the gate can effectively control conduction polarity of the first two-dimensional semiconductor layer 15 having bipolar conductivity, to control bi-directionality of the conducting path of the diode. Further, a thickness of the gate insulation layer 14 is 2 nm to 50 nm, provided that the gate 13 can well control the first two-dimensional semiconductor layer 15, because different oxides have different relative permittivities, and different oxides require different thicknesses to be used for the gate insulation layer 14. The thickness is also related to an operating voltage of an application scenario. If the operating voltage is high, the thickness needs to be increased to withstand a comparatively high operating voltage. Similarly, if the operating voltage is small, the thickness may be reduced, such that the gate-controlled diode can be effectively controlled under a small operating voltage.

Figure 2A:
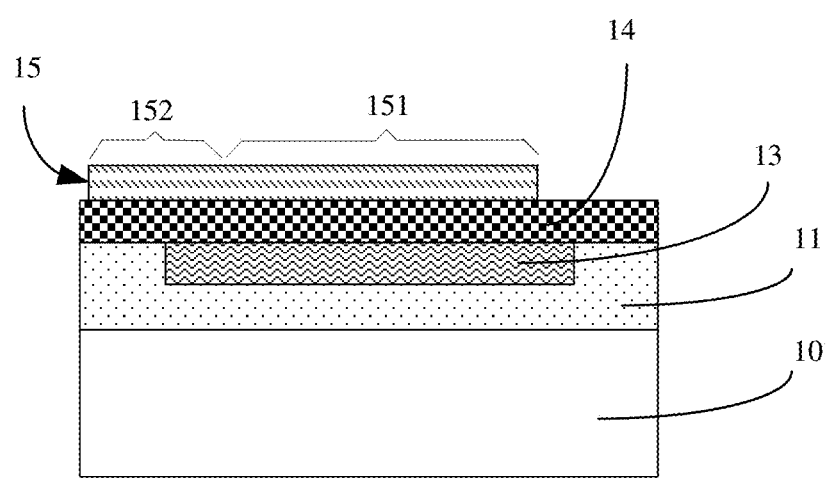
FIG. 2a is a cross-sectional schematic view of the gate-controlled diode shown in FIG. 1a after a first two-dimensional semiconductor layer is formed
Figure 2B:
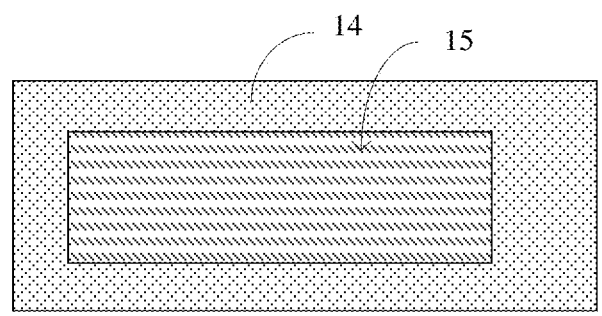
FIG. 2b is a top view of the gate-controlled diode shown in FIG. 1a after a first two-dimensional semiconductor layer is formed, in accordance with one or more embodiments.

FIG. 2a and FIG. 2b are a cross-sectional schematic view and a top view of the gate-controlled diode shown in FIG. 1a after a first two-dimensional semiconductor layer is formed, in accordance with one or more embodiments. In the X-axis direction, the first two-dimensional semiconductor layer 15 includes a first portion 151 and a second portion 152 connected to the first portion 151. The first portion 151 and the second portion 152 are a same-layer structure formed by a same process step.

In some embodiments, the first two-dimensional semiconductor layer 15 is a regular rectangular layer shape, the first portion 151 and the second portion 152 have even thicknesses, and the first two-dimensional semiconductor layer 15 is formed on a surface 140 of the gate insulation layer 14. Orthographic projections of the first portion 151 and the second portion 152 are located completely in the gate 13 and partially overlap the gate 13. A width of the first two-dimensional semiconductor layer 15 is less than or equal to a width of the gate 13, and a length of the first portion 151 is less than a length of the gate 13. When the first two-dimensional semiconductor layer 15 is irregular, the length and the width mean maximum sizes of these two dimensions. The heterojunction 17 is made only after the first two-dimensional semiconductor layer 15 and then the drain 19 are formed. Therefore, in some embodiments, the drain 19 and an isolation layer 20 are first described before embodiments of the second two-dimensional semiconductor layer 16 and the heterojunction are provided.

Figure 3:
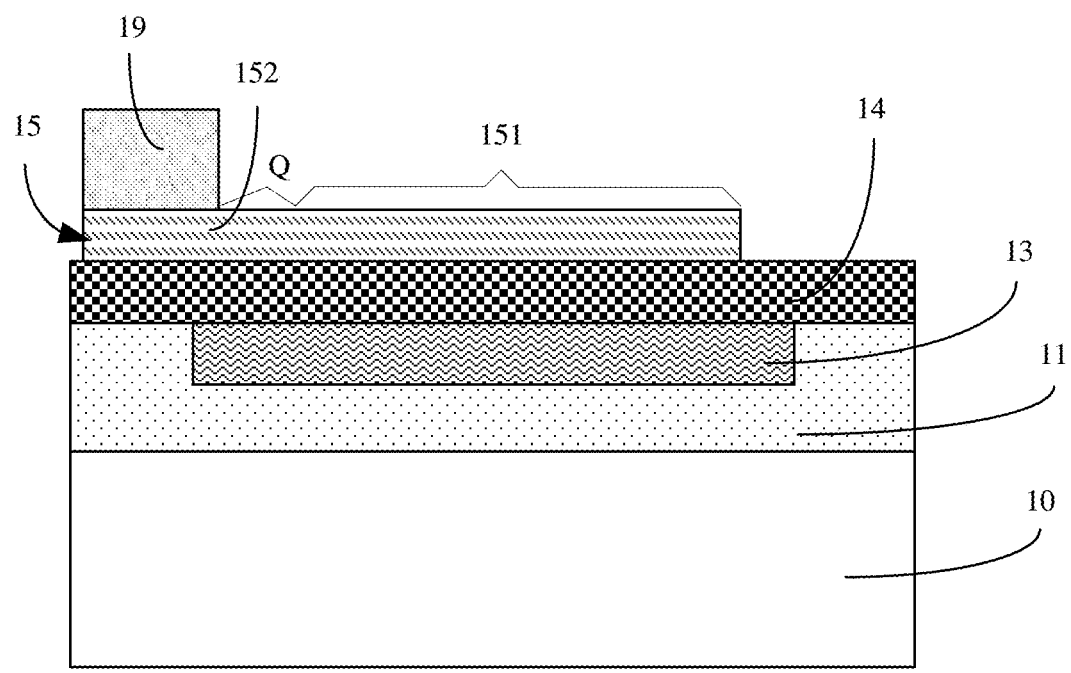
FIG. 3 is a cross-sectional schematic view of the gate-controlled diode shown in FIG. 1a after a drain is formed, in accordance with one or more embodiments.

FIG. 3 is a cross-sectional schematic view of the gate-controlled diode shown in FIG. 1a after a drain is formed, in accordance with one or more embodiments. In some embodiments, the drain 19 covers surfaces of the first two-dimensional semiconductor layer 15 and the gate insulation layer 14 using a metal layer, and is then formed, using a coating and photolithography process, on a side that is of a surface of the second portion 152 of the first two-dimensional semiconductor layer 15 and that is away from the first portion 151. In some embodiments, the drain 19 is a long bar shape with an even thickness and includes a first side surface 191 facing the source 18. A length direction of the drain 19 is a width direction of the gate 13, namely, the Z-axis direction. In some embodiments, a length of the drain 19 is greater than a width of the first two-dimensional semiconductor 15. In some embodiments, a shape of the drain is not limited to a long bar shape, but the drain covers the first two-dimensional semiconductor layer 15 and does not exceed an edge of the gate insulation layer 14, to ensure conduction efficiency. In some embodiments, a thickness of the drain 19 is in step distribution, the drain 19 covers an end of the second portion 152 and is connected to the surface of the gate insulation layer 14, but is insulated from the gate 13. In some embodiments, in order to reduce a volume of the diode device, the drain 19 is only formed on the surface of the second portion 152. In some embodiments, there is a partial region Q that is of the second portion 152 and that is between the first portion 151 of the first two-dimensional semiconductor layer 15 and the drain 19. To achieve maximum effective control by the gate 13 on the first two-dimensional semiconductor layer 15, an orthographic projection of the partial region Q is located in the gate 13. The drain 19 is spaced and insulated from an end that is of a third portion 161 and that is away from a fourth portion 162. This is implemented using an isolation layer, in accordance with one or more embodiments.

Figure 4A:
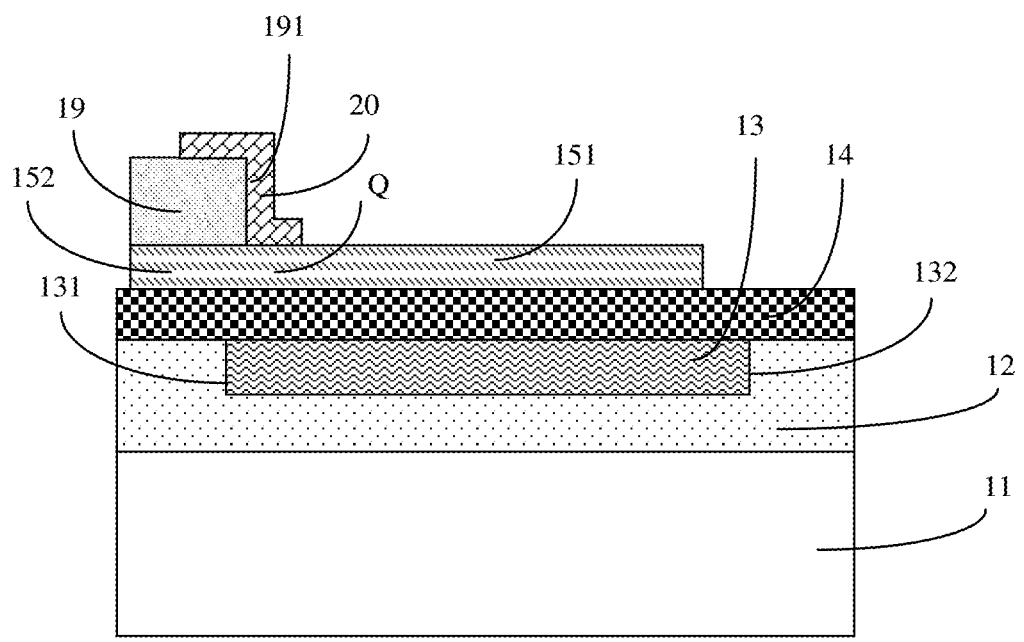
FIG. 4a is a cross-sectional schematic view of the gate-controlled diode shown in FIG. 1a after an isolation layer is formed, in accordance with one or more embodiments.
Figure 4B:
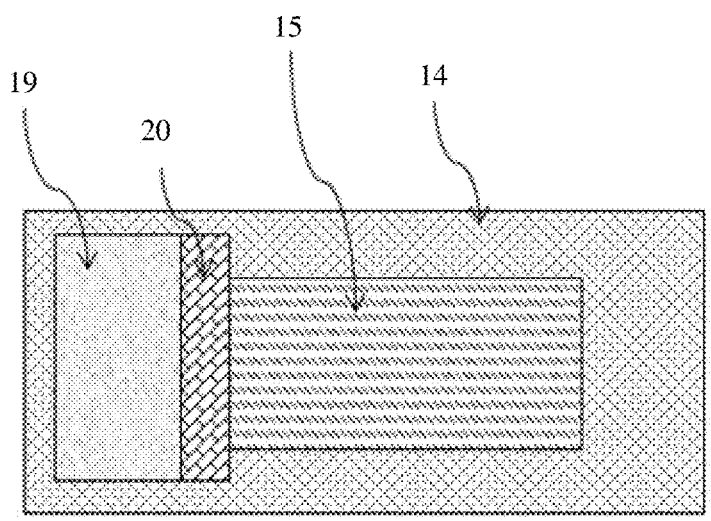
FIG. 4b is a top view of the gate-controlled diode shown in FIG. 1a after an isolation layer is formed, in accordance with one or more embodiments.

FIG. 4a, and FIG. 4b are respectively a cross-sectional schematic view and a top view of the gate-controlled diode shown in FIG. 1a after an isolation layer is formed, in accordance with one or more embodiments. In some embodiments, the gate-controlled diode further includes the isolation layer 20 disposed on the first two-dimensional semiconductor layer 15, and the isolation layer 20 is located between the drain 19 and the second two-dimensional semiconductor layer 16. In the Z-axis direction, a width of the isolation layer 20 is less than or equal to the length of the drain 19 and is greater than or equal to a width of the third portion 161, to ensure that the drain 19 can be effectively isolated from the second two-dimensional semiconductor layer 16. In the Z-axis direction, the width of the isolation layer 20 is less than the length of the drain 19, to save processing materials. The isolation layer 20 is formed on the second portion 152 of the first two-dimensional semiconductor layer 15 using a photomasking and coating process. A base material layer of the second two-dimensional semiconductor layer 16 is formed using a photolithography process, and a needless base material layer of the two-dimensional semiconductor layer connected to the drain 19 is removed using an etching process to form the second two-dimensional semiconductor layer 16 insulated from the drain. A material of the isolation layer 20 is $SiO_2$ or $Al_2O_3$. The first two-dimensional semiconductor layer 15 is grown on another base (for example, a silicon substrate or a sapphire substrate) using a film layer transfer process, and is then transferred to a base provided with the gate insulation layer, or a first two-dimensional semiconductor material layer is directly grown on the gate insulation layer and then the first two-dimensional semiconductor layer 15 having a preset pattern is obtained using a patterning process. The drain 19 is formed on the first two-dimensional semiconductor layer 15 using metal layer coating or deposition and a patterning process. Due to flatness of the gate, the first two-dimensional material layer is paved on the gate insulation layer 14. In a process of forming the first two-dimensional semiconductor material layer, cracks and wrinkles, which accordingly affect device performance, are not easy to occur in materials.

Figure 5A:
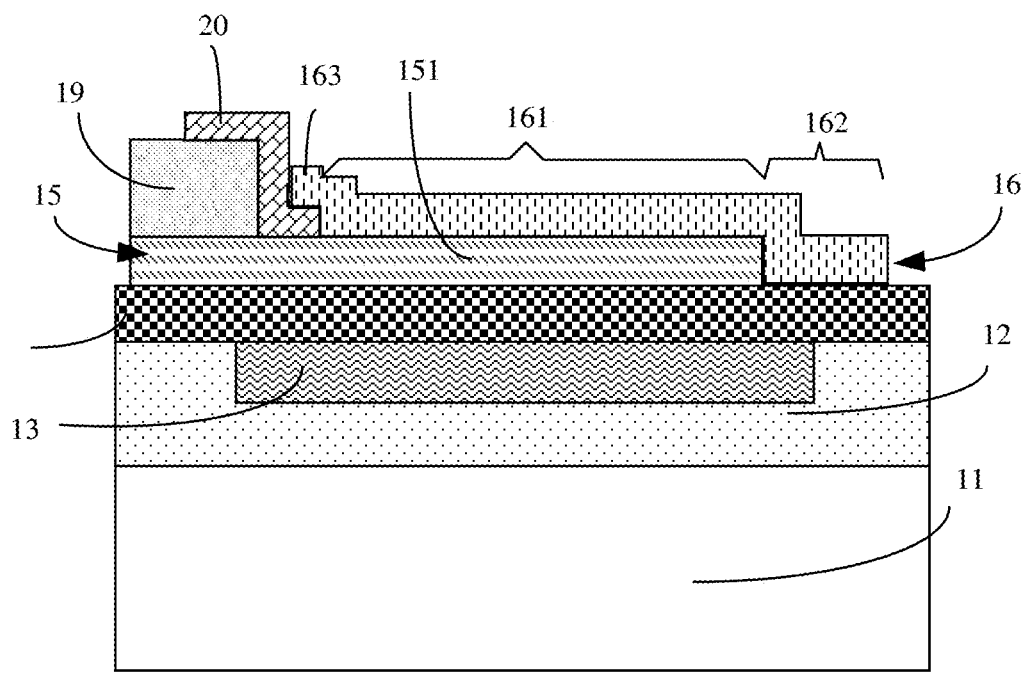
FIG. 5a is a cross-sectional schematic view of the gate-controlled diode shown in FIG. 1a after a second two-dimensional semiconductor layer is formed, in accordance with one or more embodiments.
Figure 5B:
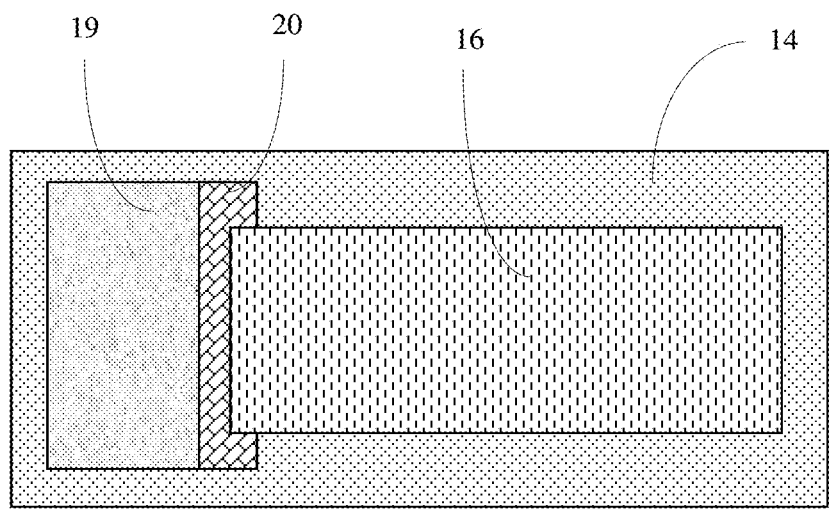
FIG. 5b is a top view of the gate-controlled diode shown in FIG. 1a after a second two-dimensional semiconductor layer is formed, in accordance with one or more embodiments.

FIG. 5a and FIG. 5b are respectively a sectional view and a top view of the gate-controlled diode shown in FIG. 1a after a second two-dimensional semiconductor layer is formed, in accordance with one or more embodiments. In some embodiments, the second two-dimensional semiconductor layer 16 includes the third portion 161, the fourth portion 162, and an extension portion 163 that are sequentially connected along the X-axis direction. The third portion 161, the fourth portion 162, and the extension portion 163 are a same-layer structure formed by a same process step. The second two-dimensional semiconductor layer 16 is a regular rectangular layer shape from a perspective of the Y-axis direction. The third portion 161 is formed on a surface of the first portion 151 and covers the first portion 151, and together with the first portion 151, forms the heterojunction 17. An orthographic projection of the heterojunction 17 is located completely in the gate 13. Orthographic projections of the third portion 161 and the first portion 151 onto the gate 13 completely coincide. It may be understood that, in the X-axis direction, a length of the third portion 161 is equal to a length of the first portion 151, and in the Y-axis direction, a width of the third portion 161 is equal to a width of the first portion 151. Certainly, the width of the third portion 161 may be greater than the width of the first portion 151. The orthographic projection of the third portion 161 is located completely in the gate 13 and partially overlaps the gate 13, that is, a width of the second two-dimensional semiconductor layer 16 is less than or equal to the width of the gate 13, and the length of the third portion 161 is less than the length of the gate 13. The third portion 161 is stacked on the surface 140 of the gate insulation layer 14 and covers an end of the first portion 151. Thicknesses of the third portion 161 and the fourth portion 162 are even and the same, and the fourth portion 162 is thicker only at a position at which a step drop is generated when the fourth portion 162 covers the end of the first portion 151 to the gate insulation layer 14.

The extension portion 163 is located on the partial region Q of the second portion 162. The isolation layer 20 is located between the drain 19 and the extension portion 163, and two opposite surfaces of the isolation layer 20 are respectively connected to the drain 19 and the extension portion 163 to insulate the drain 19 from the second two-dimensional semiconductor layer 16, to prevent electrical conduction between the drain 19 and the second two-dimensional semiconductor layer 16. One end of the isolation layer 20 extrudes from the extension portion 163 of the second two-dimensional semiconductor layer 16 and covers a portion of the drain 19, and the other end is located between the extension portion 163 and the first portion 151. The isolation layer 20 can protect the drain 19 and the first two-dimensional semiconductor layer 15 from being etched during etching of the base material layer of the second two-dimensional semiconductor layer 16, thereby achieving a protection effect. In addition, the isolation layer 20 implements an insulation effect.

In some embodiments, when the first two-dimensional semiconductor layer 15 and the second two-dimensional semiconductor layer 16 are irregular or not rectangle-shaped, the orthographic projection of the heterojunction 17 is definitely located in the gate 13, thereby ensuring effective control of a voltage of the gate 13 on the first two-dimensional semiconductor layer 15. The heterojunction formed based on tin diselenide and tungsten diselenide having bipolar conductivity can control forward conduction and reverse conduction of the gate-controlled diode by controlling the gate voltage, and the heterojunction formed of tin diselenide and tungsten diselenide has no lattice mismatch and causes no interface disadvantage. It is comparatively simple to prepare a heterojunction diode in terms of preparation processes, and the heterojunction 17 can better suppress a reverse current of the gate-controlled diode, to obtain a larger rectification ratio.

Referring to FIG. 1a and FIG. 1b, the source 18 and the drain 19 are disposed separately from each other. The source 18 is located on a side that is of a surface of the fourth portion 162 of the second two-dimensional semiconductor layer 16 and that is away from the third portion 161. A forming process of the source 18 is the same as that of the drain 19. In some embodiments, the source 18 is a long bar shape with an even thickness. A length direction of the source 18 is the width direction of the gate 13, and a length of the source 18 is greater than the width of the second two-dimensional semiconductor 16. In some embodiments, a shape of the source 18 is not limited to a long bar shape, but the source 18 covers the second two-dimensional semiconductor 16 and does not exceed the edge of the gate insulation layer 14, to ensure conduction efficiency. In some embodiments, a thickness of the source 18 is in step distribution, and the source 18 covers an end of the fourth portion 162 and is connected to the surface of the gate insulation layer 14, while being insulated from the gate 13. In some embodiments, to reduce a volume and a thickness of the diode device, the source 18 is formed on the surface of the fourth portion 162. Further, a groove is disposed on a side that is of the surface of the fourth portion 162 and that is away from the third portion 161, and the source 18 is formed in the groove. In some embodiments, an orthographic projection of the source 18 overlaps a small portion of the gate 13. In some embodiments, the source 18 is stacked on the third portion 161 that forms the heterojunction 17 and is spaced by a particular distance from the drain 19, and the distance does not affect an electric conductivity of the diode. In this case, access resistance is comparatively small, and a larger current can be obtained.

In some embodiments, as shown in FIG. 1a, the source 18 and the drain 19 are located on two opposite sides of the heterojunction 17, and the gate 13 is embedded in the oxide protective layer 12, and is not between the source and the drain and not opposite to the source and the drain. Two opposite sides of the gate 13 (viewed in the X-axis direction) are completely staggered from the source 18 and the drain 19, to avoid a larger overlapping area (according to a parallel plate capacitor principle) between the gate 13 and the source 18 and drain 19 in the X-axis direction, which generates larger overlapping parasitic capacitance. An overlapping area between the gate 13 and the source 18 and drain 19 in this application is reduced, and therefore parasitic capacitance is much smaller, to reduce parasitic capacitance between the two opposite sides of the gate 13 and the source 18 and drain 19, thereby improving electrical conductivity, and achieving a comparatively small signal loss in high-frequency application, which helps improve a high-frequency characteristic of the device.

Figure 6:
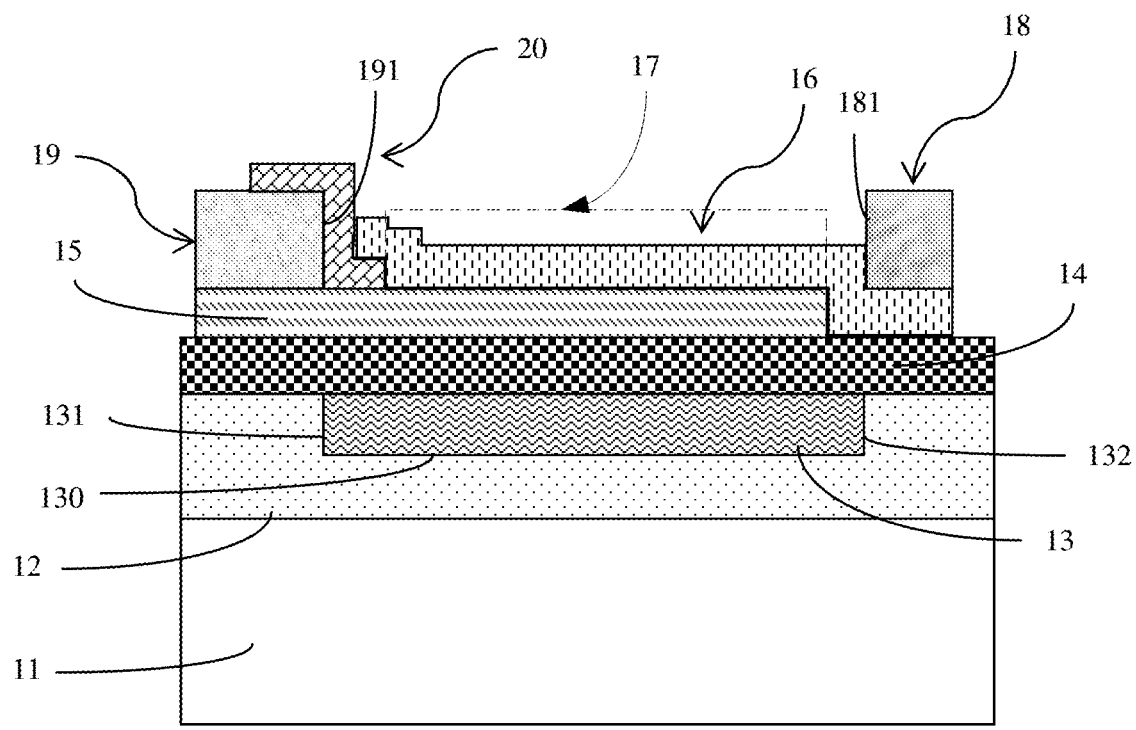
FIG. 6 is a cross-sectional schematic view of a gate-controlled diode, where a difference from FIG. 1a lies in whether there is an overlapping part between a gate and a source and drain, in accordance with one or more embodiments.

FIG. 6 is a cross-sectional schematic view of a gate-controlled diode, in accordance with one or more embodiments. The gate 13 includes a bottom surface 130, a first end surface 131, and a second end surface 132 that are connected to the oxide protective layer 12. The first end surface 131 and the second end surface 132 are connected to two opposite ends that are of the bottom surface 130 and that are in the X-axis direction. The drain 19 includes the first side surface 191 facing the source 18, the source 18 includes a second side surface 181 spaced from and opposite to the first side surface 191. In the Y-axis direction, the first side surface 191 and the first end surface 131 are coplanar or have an effective distance (a distance for implementing control of the gate on the source and the drain), and the second side surface 181 and the second end surface 132 are coplanar or have an effective distance. In some embodiments, the first side surface 191 is coplanar with the first end surface 131, and the second side surface 181 is coplanar with the second end 132, such that an overlapping region in the Y-axis direction between the drain 19 and source 18 and the gate 13 can be reduced. This better reduces parasitic capacitance between the source 18 and drain 19 and the gate 13, thereby ensuring a robust control voltage.

In some embodiments, the conducting path of the gate-controlled diode includes a forward conducting path and a reverse conducting path. The forward conducting path is a path from the drain 19 to the source 18 through the heterojunction 17. A conduction current sequentially passes through the drain 19, the second two-dimensional semiconductor layer 16 of the heterojunction 17, the first two-dimensional semiconductor layer 15, and the source 18. The reverse conducting path is a path from the source 18 to the drain 19 through the heterojunction 17. A conduction current sequentially passes through the source 18, the first two-dimensional semiconductor layer of the heterojunction 17, the second two-dimensional semiconductor layer, and the drain 19.

Figure 7A:
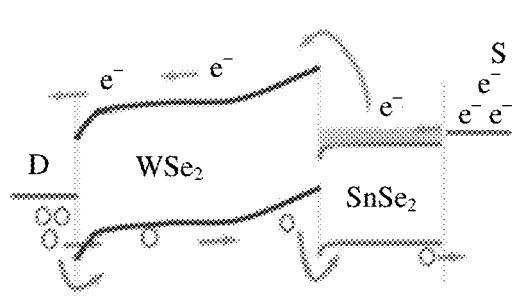
FIG. 7a is a forward operating principle diagram of the gate-controlled diode shown in FIG. 1a, in accordance with one or more embodiments.
Figure 7B:
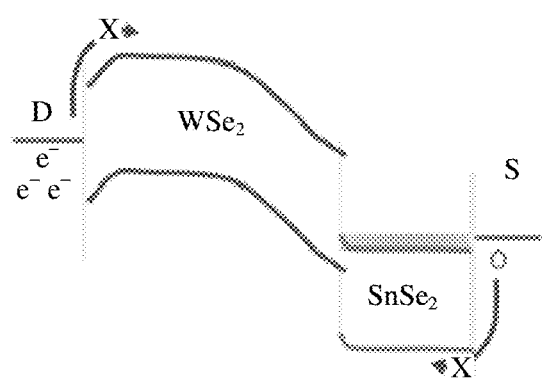
FIG. 7b is a forward operating principle diagram of the gate-controlled diode shown in FIG. 6, in accordance with one or more embodiments.

FIG. 7a and FIG. 7b are forward operating principle diagrams of a forward operating principle of a diode, in accordance with one or more embodiments. When $V_g-V_T<0$, as shown in the figures, the gate voltage performs p-type electrostatic doping on the first two-dimensional semiconductor layer 15, to form, together with the n-type conductive second two-dimensional semiconductor layer 16, a p-n junction diode. When $V_d>0$, carriers are transported in a diffusion manner, and electrons are injected into the second two-dimensional semiconductor layer 16 from the source 18, then cross a barrier (of the heterojunction) to enter the first two-dimensional semiconductor layer 15 and are collected by the drain 19. Electron holes are injected into the first two-dimensional semiconductor layer 15 from the drain 19, then cross the barrier of the heterojunction and are collected by the source 18, that is, forward conduction is complete. When $V_d<0$, the p-n junction is in a reverse bias state, and a width of the barrier of the heterojunction is large, which prevents the carriers from moving and shows a high-resistance (non-conductive) state. $V_g$ is the gate voltage, $V_T$ is a threshold voltage, and $V_d$ is a bias voltage applied to the drain.

In the case of the forward conduction, as $V_g-V_T$ decreases, a width of a barrier between the drain 19 and the first two-dimensional semiconductor layer 15 decreases, and electron holes are more easily injected into the first two-dimensional semiconductor layer 15. Therefore, the threshold voltage decreases. As shown by an I-V characteristic curve of a forward diode in FIG. 9a, the threshold voltage of the forward diode is adjustable by the gate voltage, and decreases with a decrease of the gate voltage. When the gate voltage decreases from −4 V to −5 V, the threshold voltage decreases from about 0.8 V to 0.3 V.

Figure 8A:
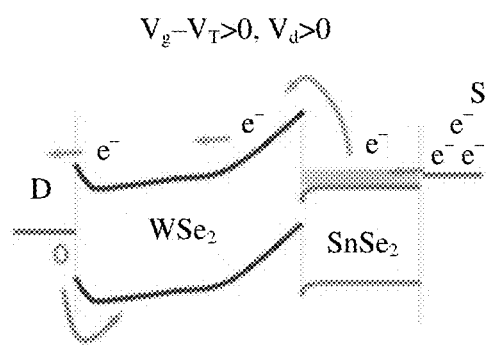
FIG. 8a is a reverse operating principle diagram of the gate-controlled diodes shown in FIG. 1a, in accordance with one or more embodiments.
Figure 8B:
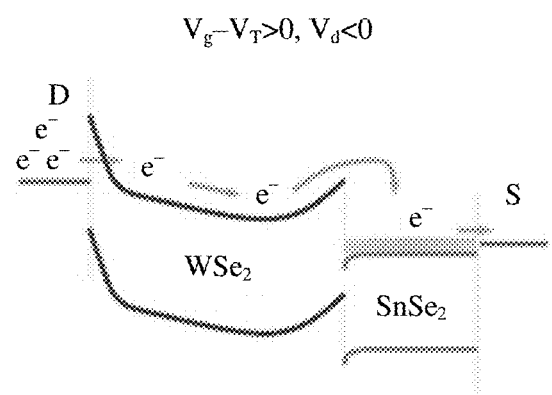
FIG. 8b is a reverse operating principle diagram of the gate-controlled diodes shown in FIG. 6, in accordance with one or more embodiments.

FIG. 8a and FIG. 8b are diagrams of reverse operating principles of a diode, in accordance with one or more embodiments. When $V_g-V_T>0$ and $V_d<0$, a principle diagram of a corresponding energy band correspondence is shown in FIG. 8b. The gate voltage performs n-type doping on the first two-dimensional semiconductor layer 15. Most carrier electrons are injected into the first two-dimensional semiconductor layer 15 by the drain 19, and then enter the source 18 after passing through the second two-dimensional semiconductor layer 16, and the diode is in a conductive state, which is reverse conduction. When $V_g-V_T>0$, and $V_d>0$, as shown in FIG. 8a, most carriers encounter a comparatively high barrier (of the heterojunction) at an interface between the second two-dimensional semiconductor layer 16 and the first two-dimensional semiconductor layer 15 after being injected by the source 18. The carriers are difficult to cross the barrier, and a very small current is generated. Minority carriers can be injected through the drain 19. However, there are a comparatively small quantity of the minority carriers, and a very small current is generated. The diode is in a high-resistance (non-conductive) state. The diode has smaller junction capacitance thereby reducing a voltage. Therefore, the diode can be used for high-frequency signal rectification.

Figures 9A, 9B:
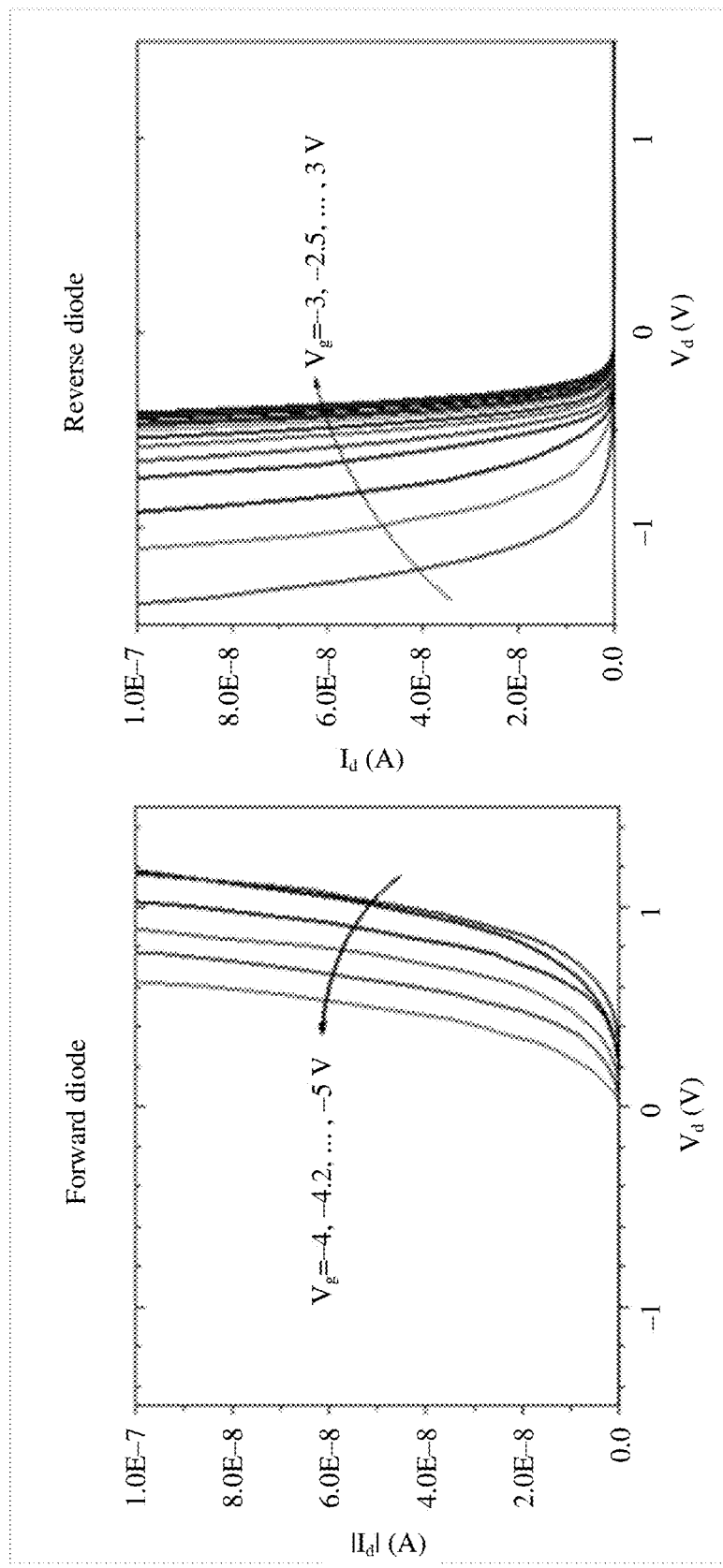
FIG. 9a is a voltage line graph of the gate-controlled diode shown in FIG. 1a controlling operating threshold voltages of a forward diode using gate voltages, in accordance with one or more embodiments.
FIG. 9b is a voltage line graph of the gate-controlled diode shown in FIG. 6 controlling operating threshold voltages of a reverse diode using gate voltages, in accordance with one or more embodiments.

When $V_g-V_T>0$, $V_d<0$, and the diode is reversely conductive, as $V_g-V_T$ increases, the width of the barrier between the drain and the second two-dimensional semiconductor layer 16 becomes smaller, electrons are more easily injected through tunneling into the first two-dimensional semiconductor layer 15 through the drain, and the threshold voltage decreases. FIG. 9b is an I-V characteristic curve of a reverse diode. A threshold voltage of the reverse diode is adjustable by a gate voltage. It can be learned from FIG. 9b that, as the gate voltage increases, the threshold voltage of the reverse diode decreases. When the gate voltage increases from −3 V to 3 V, the threshold voltage decreases from about −1 V to about −0.2 V. When the conducting path of the gate-controlled diode in this application operates using the forward diode and the reverse diode, the threshold voltage of the gate-controlled diode is controllable by the gate voltage, such that a threshold voltage as low as 0.2 V can be obtained, to implement small-signal rectification, and reduce complexity of a small-signal rectification circuit.

In some embodiments, a chip includes the gate-controlled diode. In some embodiments the chip is an integrated chip that includes a circuit and the gate-controlled diode applied to the circuit. In some embodiments, the chip is an RF chip or used as a chip of a memory. When the chip is an RF chip, the gate-controlled diode is applied to an energy collection circuit of the chip as a small-signal rectifier diode to rectify an RF signal. In some embodiments, the gate-controlled diode is used in a chip of a memory. In some embodiments, the gate-controlled diode is used in a gating circuit of a nonvolatile magnetic random access memory, a resistive random access memory, or a phase change random access memory. The chip, for example, uses the gate-controlled diode, such that a current conduction direction can be changed, thereby improving operating performance of the chip.

Figure 10:
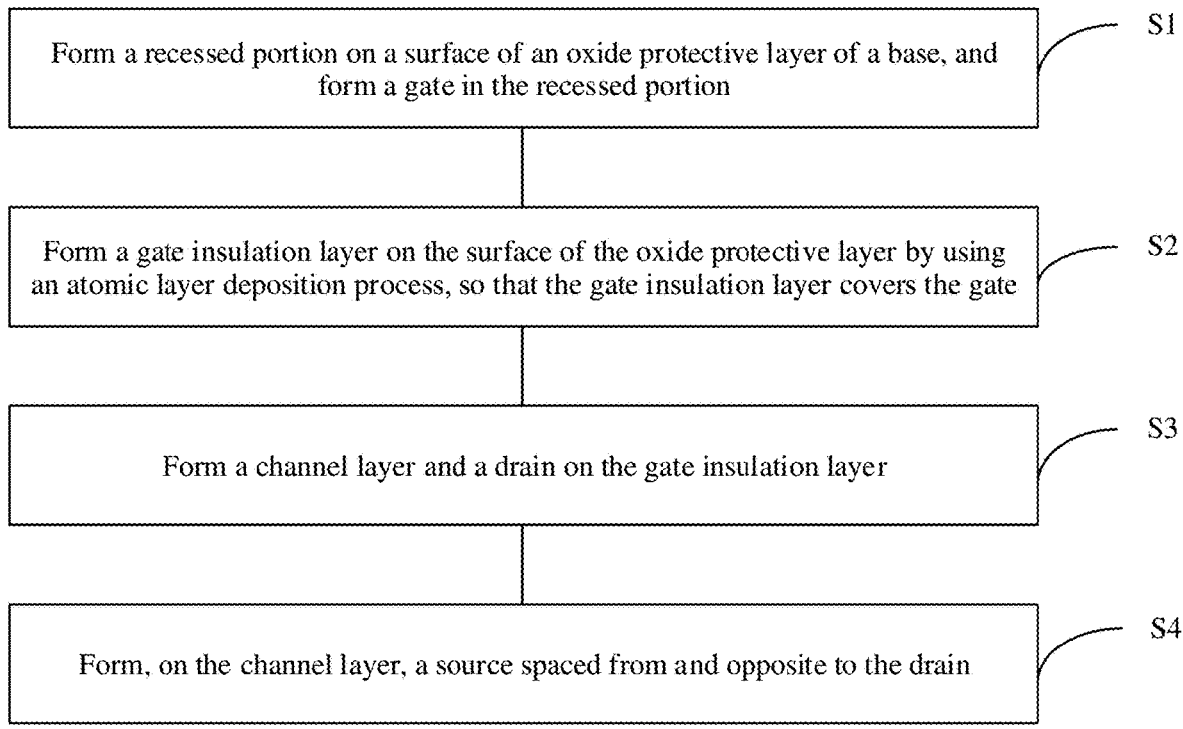
FIG. 10 is a flowchart of a method for preparing a gate-controlled diode according to this application, in accordance with one or more embodiments.

FIG. 10 is a flowchart of a method for preparing a gate-controlled diode according to this application, in accordance with one or more embodiments. FIGS. 11-14b are schematic structural diagram corresponding to various steps in a preparation process of a gate-controlled diode, in accordance with one or more embodiments. The method includes the following steps.

Step S1: Form a recessed portion on a surface 120 of an oxide protective layer 12 of a base layer 11, and form a gate 13 in the recessed portion.

Figure 11:
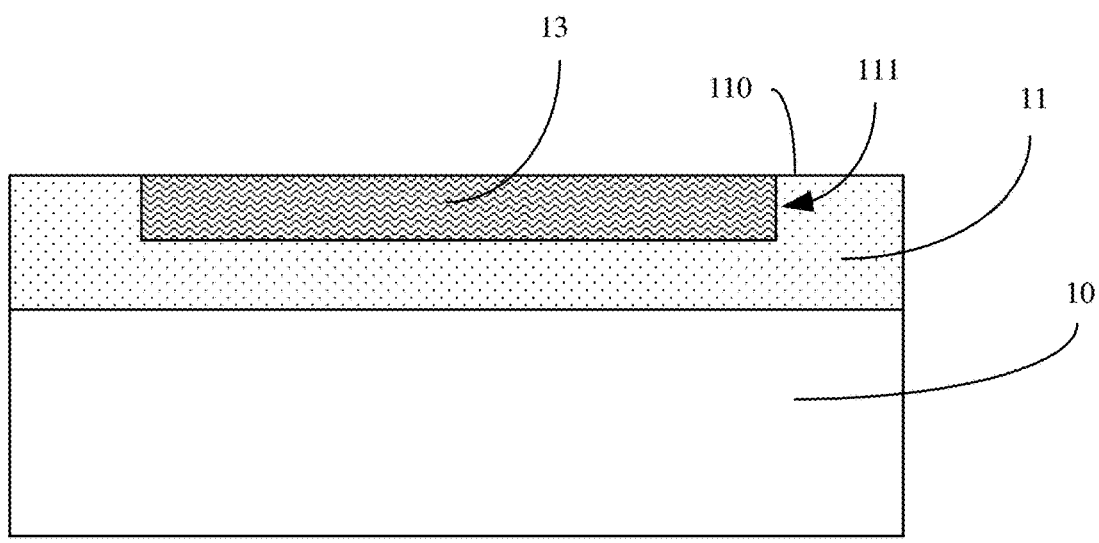
FIG. 11 is a schematic structural diagram corresponding to a step in a preparation process of a method for preparing a gate-controlled diode, in accordance with one or more embodiments.

As shown in FIG. 11, the following steps are included: Step 1: Use a photoresist to define a gate region on the oxide protective layer 12 using a photolithography process, and use the photoresist as a mask to cover a part, other than the gate region, of the surface of the oxide protective layer.

Step 2: Etch the oxide protective layer located in the gate region in a reactive-ion etching manner, to form the recessed portion in the oxide protective layer 12.

Step 3: Form the gate 13 in the recessed portion in an evaporation manner, where the gate 13 fills the recessed portion.

Step 4: Remove the photoresist.

In some embodiments, a material of the oxide protective layer 12 is silicon dioxide, a material of the base is silicon, and the gate is made of a Ti or Au material. Certainly, the base and the oxide protective layer may be replaced with an insulating material such as quartz or sapphire.

Step S1 further includes: flattening the gate 13, such that a surface that exposes the recessed portion and that is of the gate 13 is flush with the surface 120 of the oxide protective layer 12.

Figure 12:
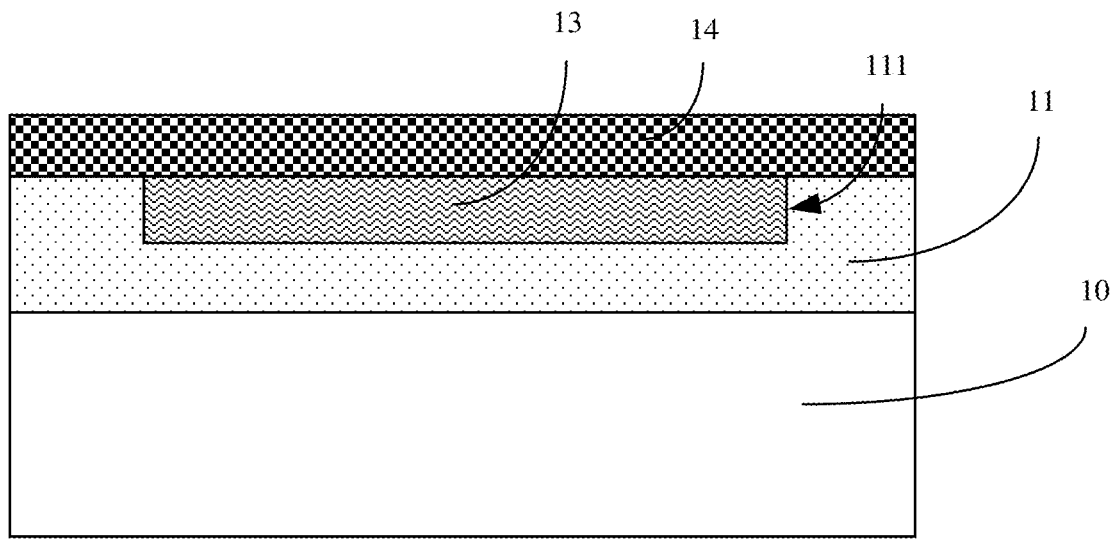
FIG. 12 is a schematic structural diagram corresponding to a step in a preparation process of a method for preparing a gate-controlled diode, in accordance with one or more embodiments.

Step S2: as shown in FIG. 12, form a gate insulation layer 14 on the surface of the oxide protective layer 12 using an atomic layer deposition process, such that the gate insulation layer 14 covers the gate 13.

The base shown in FIG. 11 is placed into an ALD chamber, and the gate insulation layer is grown using an atomic layer deposition technology. The gate insulation layer uses one of $HfO_2$, $Al_2O_3$, $ZrO_2$, $HfxZr1-xO_2$, HfLaO, or $Y_2O_3$ that has a high relative permittivity instead of using silicon dioxide, and a thickness may be made comparatively thin using the atomic layer deposition technology, such that gate capacitance is increased, and the gate can effectively control conduction polarity of the first two-dimensional material 15. In some embodiments, a thickness of the gate insulation layer is 10 nm.

Step S3: as shown in FIG. 3 and FIG. 1*a*, form a channel layer and a drain 19 on the gate insulation layer 14, where the channel layer includes a first two-dimensional semiconductor layer 15, a second two-dimensional semiconductor layer 16, and a heterojunction 17 formed by the first two-dimensional semiconductor layer 15 and the second two-dimensional semiconductor layer 16, and the drain 19 is located on the first two-dimensional semiconductor layer 15 and is insulated from the second two-dimensional semiconductor layer 16.

In some embodiments, a material of the first two-dimensional semiconductor layer is tungsten diselenide having bipolar conductivity, and a material of the second two-dimensional semiconductor layer is tin diselenide. In some embodiments, the drain 19 is completed after the first two-dimensional semiconductor layer 15 is formed and before the second two-dimensional semiconductor layer 16 is formed. Details are as follows.

This step includes: as shown in FIG. 3, forming, on a surface of the gate insulation layer 14, the first two-dimensional semiconductor layer 15 and the drain 19 that is located on a side of a surface of the first two-dimensional semiconductor layer 15. In this step, the first two-dimensional semiconductor layer 15 is grown on another base (for example, a silicon substrate or a sapphire substrate) using a film layer transfer process, and then is transferred to a base provided with the gate insulation layer, or a first two-dimensional semiconductor material layer is directly grown on the gate insulation layer and then the first two-dimensional semiconductor layer 15 having a preset pattern is obtained using a patterning process. The drain 19 is then formed on the first two-dimensional semiconductor layer 15 through metal layer coating or deposition and using a patterning process. Due to flatness of the gate, the first two-dimensional material layer is paved on the gate insulation layer 14. In a process of forming the first second material layer, cracks and wrinkles, which accordingly affect device performance, are not easy to occur in materials.

Figure 13A:
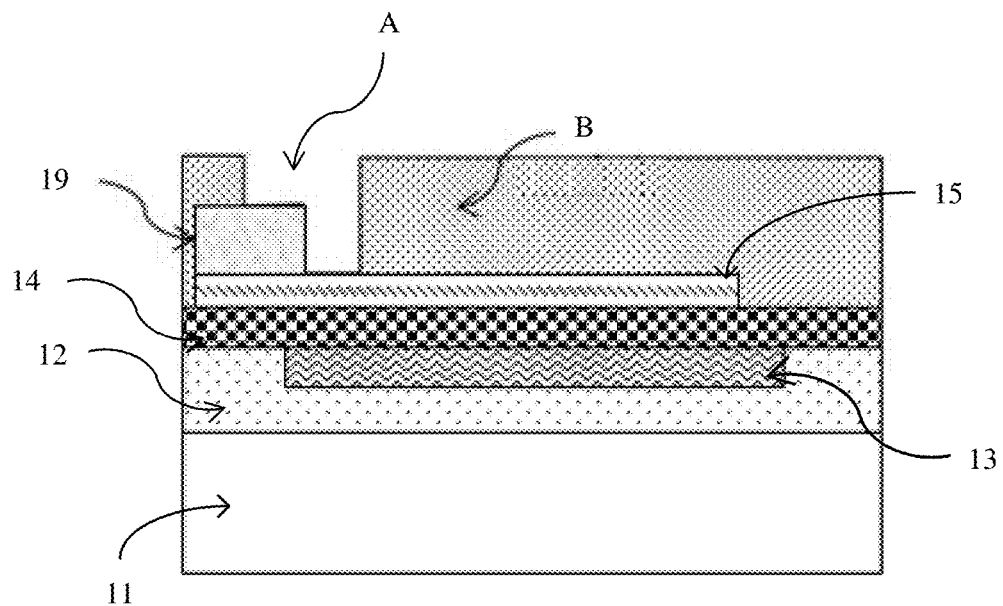
FIG. 13a is a schematic structural diagram corresponding to a step in a preparation process of a method for preparing a gate-controlled diode, in accordance with one or more embodiments.
Figure 13B:
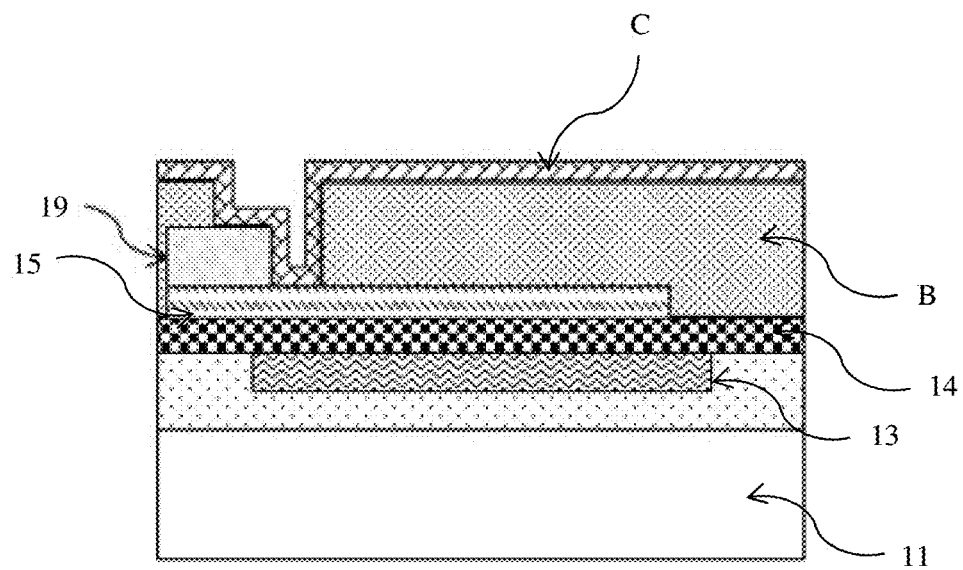
FIG. 13b is a schematic structural diagram corresponding to a step in a preparation process of a method for preparing a gate-controlled diode, in accordance with one or more embodiments.

Referring to FIG. 13*a* and FIG. 13*b*. A photoresist B is used to define, using a photolithography process, an isolation layer region A on a layer structure including the first two-dimensional semiconductor layer 15 and the drain 19, and a photoresist B is used as a mask to cover a part, other than the isolation layer region A, of the first two-dimensional semiconductor layer 15 and a portion of drain 19.

An insulating oxide layer C is formed on the photoresist B and the isolation layer region A in a deposition manner.

As shown in FIG. 4*a* and FIG. 4*b*, the photoresist B covered with the insulating oxide layer C is removed to form an isolation layer 20 in the isolation layer region A, where the isolation layer covers a portion of the drain 19 and a connection position between the drain 19 and the first two-dimensional semiconductor layer 15. The isolation layer 20 may insulate the drain from the subsequently formed second two-dimensional semiconductor layer 16. In addition, this step is more suitable for protection on the drain and the first two-dimensional semiconductor layer 15 during large-area fabrication of a diode.

Figure 14A:
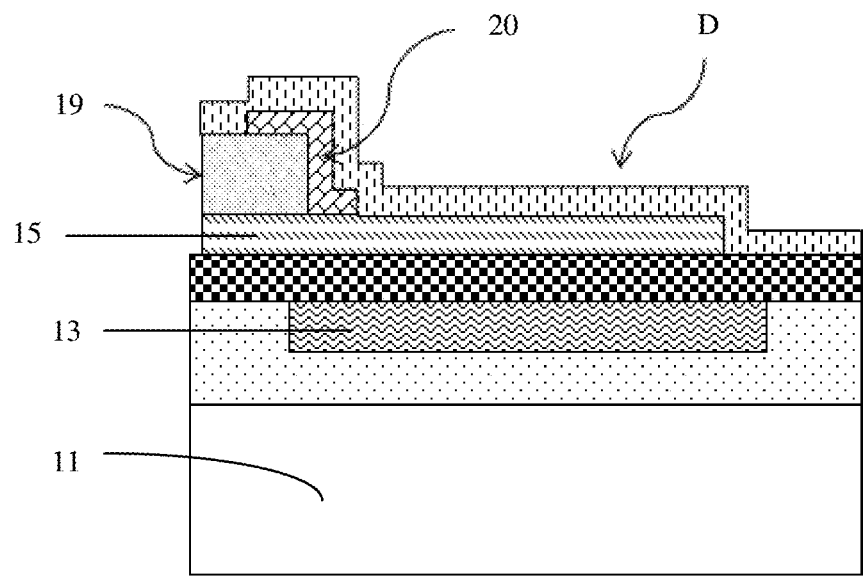
FIG. 14a is a schematic structural diagram corresponding to a step in a preparation process of a method for preparing a gate-controlled diode, in accordance with one or more embodiments.
Figure 14B:
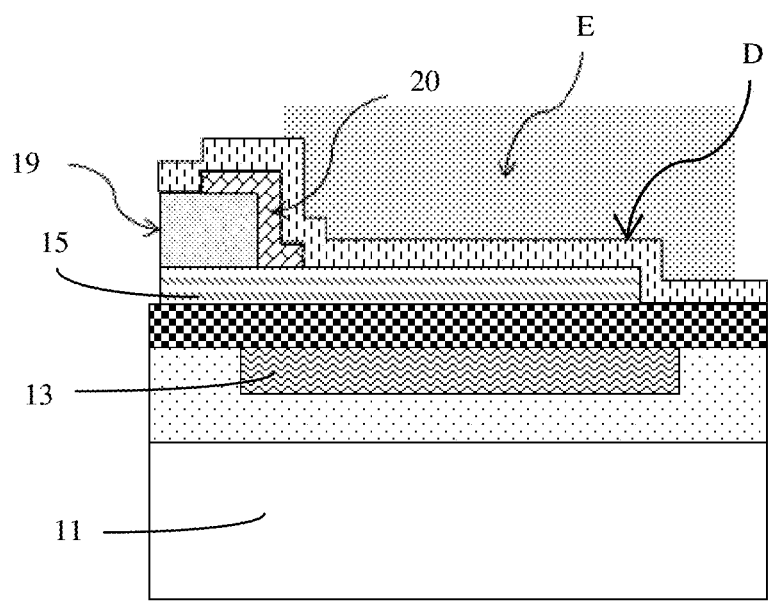
FIG. 14b is a schematic structural diagram corresponding to a step in a preparation process of a method for preparing a gate-controlled diode, in accordance with one or more embodiments.

As shown in FIG. 14*a*, FIG. 14*b*, and FIG. 6, the second two-dimensional semiconductor layer 16 and the heterojunction 17 are formed on the surface of the gate insulation layer 14 and the first two-dimensional semiconductor layer 15. An overlapping part between the first two-dimensional semiconductor layer 15 and the second two-dimensional semiconductor layer 16 is the heterojunction 17, and the second two-dimensional semiconductor layer 16 is connected to a side that is of the isolation layer and that is away from the drain 19. A second two-dimensional semiconductor material layer D is formed on the drain 19, the isolation layer 20, the first two-dimensional semiconductor layer 15, and an uncovered portion of the gate insulation layer. The second two-dimensional semiconductor material layer is grown on another base (for example, a silicon substrate or a sapphire substrate) using a film layer transfer process, and then is transferred to a base provided with the first two-dimensional semiconductor layer 15, or is directly grown on the first two-dimensional semiconductor layer 15. Then, the second two-dimensional semiconductor material layer D is etched using the photoresist E as a mask and using a patterning process to form the second two-dimensional semiconductor layer 16 having a preset pattern, and the overlapping part between the first two-dimensional semiconductor layer 15 and the second two-dimensional semiconductor layer 16 is the heterojunction 17. The first two-dimensional semiconductor layer 15 and the second two-dimensional semiconductor layer 16 form the channel layer.

In this step, in a process of etching the second two-dimensional semiconductor material layer D, the drain 19 and the first two-dimensional semiconductor layer 15 between the drain 19 and an end of the second two-dimensional semiconductor material layer D can be protected using the isolation layer 20, to avoid that a gap between the drain 19 and the end of the second two-dimensional semiconductor material layer D is excessively large (which affects conduction performance) or excessively small (which damages the drain), thereby avoiding unintended damage to the first two-dimensional semiconductor layer 15 and consequent damage to performance of the gate-controller diode. In addition, the second two-dimensional semiconductor layer 16 covers the first two-dimensional semiconductor layer 15 to completely isolate the source from the first two-dimensional semiconductor layer 15.

Referring to FIG. 1a again. Step S4: form, on the channel layer, a source 18 spaced from and opposite to the drain 19, where a first conduction direction is implemented from the source 18 to the drain 19 through the heterojunction 17, and a second conduction direction is implemented from the drain 19 to the source 18 through the heterojunction 17.

The source 18 may be located at an end that is of the surface of the second two-dimensional semiconductor layer 16 and that is away from the drain 19, or may be located above the heterojunction. In some embodiments, a groove is disposed on a side that is of the second two-dimensional semiconductor layer 16 and that is opposite to the drain, and the source 18 is located in the groove, to reduce a step of a layer structure of the entire diode. The source and the drain are located on two sides of the heterojunction, to reduce parasitic capacitance between the source and drain and the gate. With reference to FIG. 7a to FIG. 9b, the first conduction direction is forward conduction, and the diode is a forward diode; the second conduction direction is reverse conduction, and the diode is a reverse diode.

According to the method for preparing a gate-controlled diode in some embodiments of this application, diodes may be simultaneously manufactured in a large quantity. Actually, the substrate includes a plurality of gate-controlled diode regions. Each gate-controlled diode region is configured to form one gate-controlled diode, and layers, with a same function, of the plurality of gate-controlled diodes are formed simultaneously by performing a same process step. For example, during formation of isolation layers, isolation layers of the plurality of gate-controlled diodes are formed using large-area formation of an isolation material layer and then unified patterning. In this way, processing process steps can be reduced, and costs can be reduced.

The foregoing descriptions are exemplary implementations of the present disclosure. It should be noted that a person of ordinary skill in the art may make improvements and polishing without departing from the principle of the present disclosure and the improvements and polishing shall fall within the protection scope of the present disclosure.

What is claimed is:

1. A gate-controlled diode, comprising:
a substrate;
a gate insulation layer;
a gate, stacked on the substrate, wherein the gate is embedded in a surface of the substrate, and the gate insulation layer covers the surface of the substrate in which the gate is disposed;
a first two-dimensional semiconductor layer comprising a bipolar conductive material, wherein the first two-dimensional semiconductor layer is stacked on the gate insulation layer;
a second two-dimensional semiconductor layer, wherein a portion of the second two-dimensional semiconductor layer is stacked on the gate insulation layer, another portion of the second two-dimensional semiconductor layer is stacked on the first two-dimensional semiconductor layer, the another portion of the second two-dimensional semiconductor layer stacked on the first two-dimensional semiconductor layer forms a heterojunction, and an orthographic projection of the heterojunction onto the substrate is in an orthographic projection of the gate onto the substrate;
a source, wherein the source is stacked on the second two-dimensional semiconductor layer, the source is electrically connected to the second two-dimensional semiconductor layer, and the source is insulated from the first two-dimensional semiconductor layer;
a drain, disposed separately from the source, wherein the drain is stacked on the first two-dimensional semiconductor layer, the drain is electrically connected to the first two-dimensional semiconductor layer, and the drain is insulated from the second two-dimensional semiconductor layer; and
an isolation layer between the drain and an end of the second two-dimensional semiconductor layer, and between the first two-dimensional semiconductor layer and the second two-dimensional semiconductor layer,
wherein
the gate comprises:
a bottom surface;
a first end surface, closer to the drain than the source; and
a second end surface, closer to the source than the drain, wherein the first end surface and the second end surface are connected to two opposite ends of the bottom surface,
the drain comprises:
a first side surface on a side of the drain facing the source,
the source comprises:
a second side surface spaced from and facing the first side surface, and
the first side surface is coplanar with the first end surface, and the second side surface is coplanar with the second end surface.

2. The gate-controlled diode of claim 1, wherein a material of the gate insulation layer includes one of $HfO_2$, $Al_2O_3$, $ZrO_2$, $HfxZr1-xO_2$, $HfLaO$, or $Y_2O_3$.

3. The gate-controlled diode of claim 1, wherein a thickness of the gate insulation layer is 2 nm to 50 nm.

4. The gate-controlled diode of claim 1, wherein a material of the second two-dimensional semiconductor layer includes a two-dimensional semiconductor material with heavy p-type or n-type ion doping.

5. The gate-controlled diode of claim 1, wherein a material of the first two-dimensional semiconductor layer includes tungsten diselenide, and a material of the second two-dimensional semiconductor layer includes tin diselenide.

6. The gate-controlled diode of claim 1, wherein the first two-dimensional semiconductor layer comprises:
a first portion; and
a second portion, connected to the first portion; and
wherein the second two-dimensional semiconductor layer comprises:
a third portion; and
a fourth portion, connected to the third portion, wherein the third portion is stacked on the first portion to form the heterojunction, the source is on a surface of the fourth portion, and the drain is on a surface of the second portion.

7. The gate-controlled diode of claim 1, wherein a material of the isolation layer is insulating oxide.

8. The gate-controlled diode of claim 1, wherein the substrate comprises a base layer and an oxide protective layer, wherein the oxide protective layer is stacked on a surface of the base layer, and wherein a side of the gate facing the gate insulation layer protrudes from the oxide protective layer.

9. The gate-controlled diode of claim 1, wherein the substrate comprises a base layer and an oxide protective layer, wherein the oxide protective layer is stacked on a surface of the base layer, and wherein a side of the gate facing the gate insulation layer is flush with a surface of the oxide protective layer.

10. The gate-controlled diode of claim 1, wherein the substrate comprises:
    a base layer; and
    an oxide protective layer, and
    the bottom surface is connected to the oxide protective layer.

11. The gate-controlled diode of claim 1, wherein an entirety of the source is over the second two-dimensional semiconductor layer, and an entirety of the drain is over the first two-dimensional semiconductor layer.

12. The gate-controlled diode of claim 1, wherein the second two-dimensional semiconductor layer is separated from the first two-dimensional semiconductor layer by the isolation layer, and a portion of the second two-dimensional semiconductor layer separated from the first two-dimensional semiconductor layer by the isolation layer is between the drain and a portion of the second two-dimensional semiconductor layer that forms the heterojunction.

13. A chip, comprising a circuit and a gate-controlled diode, wherein the gate-controlled diode comprises:
    a substrate;
    a gate insulation layer;
    a gate, stacked on the substrate, wherein the gate is embedded in a surface of the substrate, and the gate insulation layer covers the surface of the substrate in which the gate is disposed;
    a first two-dimensional semiconductor layer, comprising a bipolar conductive material, wherein the first two-dimensional semiconductor layer is stacked on the gate insulation layer;
    a second two-dimensional semiconductor layer, wherein a portion of the second two-dimensional semiconductor layer is stacked on the gate insulation layer, another portion of the second two-dimensional semiconductor layer is stacked on the first two-dimensional semiconductor layer, the another portion of the second two-dimensional semiconductor layer stacked on the first two-dimensional semiconductor layer forms a heterojunction, and an orthographic projection of the heterojunction onto the substrate is in an orthographic projection of the gate onto the substrate;
    a source, wherein the source is stacked on the second two-dimensional semiconductor layer, the source is electrically connected to the second two-dimensional semiconductor layer, and the source is insulated from the first two-dimensional semiconductor layer; and
    a drain, disposed separately from the source, wherein the drain is stacked on the first two-dimensional semiconductor layer, the drain is electrically connected to the first two-dimensional semiconductor layer, and the drain is insulated from the second two-dimensional semiconductor layer; and
    an isolation layer between the drain and an end of the second two-dimensional semiconductor layer, and between the first two-dimensional semiconductor layer and the second two-dimensional semiconductor layer, wherein
    the gate comprises:
        a bottom surface;
        a first end surface, closer to the drain than the source; and
        a second end surface, closer to the source than the drain, wherein the first end surface and the second end surface are connected to two opposite ends of the bottom surface,
    the drain comprises:
        a first side surface on a side of the drain facing the source,
    the source comprises:
        a second side surface spaced from and facing the first side surface, and
    the first side surface is coplanar with the first end surface, and the second side surface is coplanar with the second end surface.

14. The chip of claim 13, wherein a material of the gate insulation layer includes one of $HfO_2$, $Al_2O_3$, $ZrO_2$, $Hf_xZr_{1-x}O_2$, HfLaO, or $Y_2O_3$.

15. The chip of claim 13, wherein a material of the second two-dimensional semiconductor layer includes a two-dimensional semiconductor material with heavy p-type or n-type ion doping.

16. The chip of claim 13, wherein a material of the first two-dimensional semiconductor layer includes tungsten diselenide, and a material of the second two-dimensional semiconductor layer includes tin diselenide.

17. The chip of claim 13, wherein the first two-dimensional semiconductor layer comprises:
    a first portion; and
    a second portion, connected to the first portion; and
    wherein the second two-dimensional semiconductor layer comprises:
    a third portion; and
    a fourth portion, connected to the third portion, the third portion is stacked on the first portion to form the heterojunction, the source is on a surface of the fourth portion, and the drain is located on a surface of the second portion.

18. The chip of claim 13, wherein the substrate comprises a base layer and an oxide protective layer, wherein the oxide protective layer is stacked on a surface of the base layer, and wherein a side of the gate facing the gate insulation layer protrudes from the oxide protective layer.

19. The chip of claim 13, wherein the substrate comprises a base layer and an oxide protective layer, wherein the oxide protective layer is stacked on a surface of the base layer, and wherein a side of the gate facing the gate insulation layer is flush with a surface of the oxide protective layer.

20. The chip of claim 13, wherein
the substrate comprises:
    a base layer; and
    an oxide protective, and
    the bottom surface is connected to the oxide protective layer.

* * * * *